United States Patent
Zheng et al.

(10) Patent No.: US 11,899,498 B2
(45) Date of Patent: Feb. 13, 2024

(54) FLEXIBLE PRINTED CIRCUIT AND DISPLAY APPARATUS

(71) Applicant: BOE TECHNOLOGY GROUP CO., LTD., Beijing (CN)

(72) Inventors: Meizhu Zheng, Beijing (CN); Yuanyuan Li, Beijing (CN)

(73) Assignee: BOE TECHNOLOGY GROUP CO., LTD., Beijing (CN)

(\*) Notice: Subject to any disclaimer, the term of this patent is extended or adjusted under 35 U.S.C. 154(b) by 332 days.

(21) Appl. No.: 17/599,449

(22) PCT Filed: Oct. 29, 2020

(86) PCT No.: PCT/CN2020/124946
§ 371 (c)(1),
(2) Date: Sep. 28, 2021

(87) PCT Pub. No.: WO2022/087986
PCT Pub. Date: May 5, 2022

(65) Prior Publication Data
US 2022/0317735 A1    Oct. 6, 2022

(51) Int. Cl.
*H05K 1/11* (2006.01)
*G06F 1/16* (2006.01)
(Continued)

(52) U.S. Cl.
CPC ............ *G06F 1/1652* (2013.01); *G06F 1/183* (2013.01); *G09G 3/035* (2020.08); *H05K 1/028* (2013.01);
(Continued)

(58) Field of Classification Search
CPC ............... H05K 1/028; H05K 1/115; H05K 2201/09636
See application file for complete search history.

(56) References Cited

U.S. PATENT DOCUMENTS

2004/0020687 A1\* 2/2004 Moore ................ H05K 1/0212
219/209
2016/0270234 A1\* 9/2016 Ahn ....................... H05K 1/028
(Continued)

FOREIGN PATENT DOCUMENTS

CN    206977803 U    2/2018
CN    207182247 U    4/2018
(Continued)

*Primary Examiner* — Sherman Ng
(74) *Attorney, Agent, or Firm* — IP & T GROUP LLP

(57) ABSTRACT

A flexible printed circuit includes an insulating base. The insulating base includes a body portion and at least one first extension portion connected to an edge of the body portion. The first extension portion includes a via region, a bending region and a banding region that are sequentially away from the body portion. A plurality of vias are disposed in the via region. The plurality of vias include at least one first via and at least one second via, a center of an orthogonal projection of a first via on a reference plane perpendicular to a thickness direction of the insulating base is located on a first straight line parallel to a bending axis of the bending region, and a center of an orthogonal projection of a second via on the reference plane is not located on the first straight line.

15 Claims, 5 Drawing Sheets

(51) Int. Cl.
    *G09G 3/00*          (2006.01)
    *G06F 1/18*          (2006.01)
    *H05K 1/02*          (2006.01)
    *H05K 1/18*          (2006.01)

(52) U.S. Cl.
    CPC ........... *H05K 1/0216* (2013.01); *H05K 1/115* (2013.01); *G09G 2380/02* (2013.01); *H05K 1/181* (2013.01)

(56) References Cited

U.S. PATENT DOCUMENTS

2017/0135216 A1* 5/2017 Cho .................. H05K 1/148
2020/0348733 A1* 11/2020 Ju .................... G06F 1/1683

FOREIGN PATENT DOCUMENTS

| CN | 108495488 | A  | 9/2018  |
|----|-----------|----|---------|
| CN | 109788639 | A  | 5/2019  |
| EP | 0926934   | A3 | 12/2000 |

\* cited by examiner

FLEXIBLE PRINTED CIRCUIT AND DISPLAY APPARATUS

CROSS-REFERENCE TO RELATED APPLICATIONS

This application is a national phase entry under 35 USC 371 of International Patent Application No. PCT/CN2020/124946, filed on Oct. 29, 2020, which is incorporated herein by reference in its entirety.

TECHNICAL FIELD

The present disclosure relates to the field of display technologies, and in particular, to a flexible printed circuit and a display apparatus.

BACKGROUND

Flexible printed circuit is a highly reliable and excellent flexible printed circuit using a polyimide or polyester film as a base, has characteristics of high wiring density, light weight, and small thickness, and is mainly used in many products such as mobile phones, notebook computers, personal digital assistants (PDAs), and digital cameras.

SUMMARY

In one aspect, a flexible printed circuit is provided. The flexible printed circuit includes an insulating base. The insulating base includes a body portion and at least one first extension portion connected to an edge of the body portion. A first extension portion includes a via region, a bending region, and a bonding region that are sequentially away from the body portion. A plurality of vias are disposed in the via region, and the plurality of vias include at least one first via and at least one second via. A center of an orthogonal projection of a first via on a reference plane perpendicular to a thickness direction of the insulating base is located on a first straight line parallel to a bending axis of the bending region, and a center of an orthogonal projection of a second via on the reference plane is not located on the first straight line.

In some embodiments, a straight line where the center of the orthogonal projection of the first via on the reference plane and the center of the orthogonal projection of the second via on the reference plane are located is a second straight line. An included angle between the second straight line and the first straight line is $\alpha$, and $\alpha$ is greater than 15°, and is less than or equal to 90° ($15° < \alpha \le 90°$).

In some embodiments, a straight line where the center of the orthogonal projection of the first via on the reference plane and the center of the orthogonal projection of the second via on the reference plane are located is a second straight line. An included angle between the second straight line and the first straight line is $\alpha$, $\alpha$ is greater than 0°, and is less than or equal to 15° ($0° < \alpha \le 15°$); and a distance between the first via and the second via in a direction parallel to the first straight line is greater than or equal to 1 mm.

In some embodiments, the distance between the first via and the second via in the direction parallel to the first straight line is in a range from 1 mm to 2 mm; and/or, a distance between two adjacent first vias in the direction parallel to the first straight line is greater than or equal to 2 mm.

In some embodiments, centers of orthogonal projections of any two vias in the plurality of vias on the reference plane are not located on a same straight line parallel to the bending axis of the bending region.

In some embodiments, the plurality of vias are sequentially divided into at least two parts of vias in a direction parallel to the first straight line; in two adjacent parts of vias, a part of vias are gradually away from the bending region in a direction perpendicular to the first straight line, and another part of vias are gradually proximate to the bending region in the direction perpendicular to the first straight line.

In some embodiments, the plurality of vias are sequentially divided into four parts of vias in the direction parallel to the first straight line.

In some embodiments, the flexible printed circuit further includes: a first conductive layer disposed on a first surface of the insulating base, the first conductive layer including a plurality of first pins and a plurality of first conductive traces, the plurality of first pins being located in the bonding region, and first ends of the plurality of first conductive traces being connected in a one-to-one correspondence with at least a part of first pins in the plurality of first pins; and a second conductive layer disposed on a second surface, opposite to the first surface, of the insulating base, the second conductive layer including a plurality of second conductive traces, and first ends of the plurality of second conductive traces being connected in a one-to-one correspondence with second ends of the plurality of first conductive traces through the plurality of vias.

In some embodiments, the at least one first extension portion includes two first extension portions. A part of first pins in the plurality of first pins are located in the bonding region of one of the two first extension portions; and another part of first pins in the plurality of first pins are located in the bonding region of another first extension portion. First ends of a part of first conductive traces in the plurality of first conductive traces are connected in a one-to-one correspondence with at least a part of first pins in the part of first pins; and first ends of another part of first conductive traces in the plurality of first conductive traces are connected in a one-to-one correspondence with at least a part of first pins in the another part of first pins. First ends of a part of second conductive traces in the plurality of second conductive traces are connected in a one-to-one correspondence with second ends of the part of first conductive traces through vias in the first extension portion; and first ends of another part of second conductive traces in the plurality of second conductive traces are connected in a one-to-one correspondence with second ends of the another part of first conductive traces through vias in the another first extension portion.

In some embodiments, the two first extension portions are both connected to a first side edge of the body portion.

In some embodiments, the flexible printed circuit further includes a chip disposed on the body portion. Second ends of the plurality of second conductive traces are directly or indirectly connected to the chip.

In some embodiments, the first conductive layer further includes a plurality of fourth conductive traces and a plurality of fifth conductive traces, the plurality of fourth conductive traces are connected to the chip and first conductive traces, and first ends of the plurality of fifth conductive traces are connected to a part of second conductive traces in the plurality of second conductive traces, and second ends of the plurality of fifth conductive traces are connected to second ends of another part of second conductive traces in the plurality of second conductive traces.

In some embodiments, the chip is a touch chip or driving control chip.

In some embodiments, the insulating base further includes a second extension portion connected to a second side edge of the body portion, the first side edge and the second side edge being located on opposite sides of the body portion; and the flexible printed circuit further includes a plug-in structure disposed at an end of the second extension portion away from the body portion.

In some embodiments, the flexible printed circuit further includes: a first insulating layer located on a side of the first conductive layer away from the insulating base; a second insulating layer located on a side of the second conductive layer away from the insulating base; a first shielding layer located on a side of the first insulating layer away from the insulating base, the first shielding layer covering the body portion and the via region; and a second shielding layer located on a side of the second insulating layer away from the insulating base, the second shielding layer covering the body portion and the via region. The first shielding layer and the second shielding layer are used to shield electromagnetic waves.

In some embodiments, the flexible printed circuit further includes a protective layer disposed on a side of the second shielding layer away from the insulating base, the protective layer covering the via region.

In another aspect, a display apparatus is provided. The display apparatus includes the flexible printed circuit as described in any of the above embodiments; and a display panel, a portion of the first extension portion of the flexible printed circuit in the bonding region being bonded to the display panel.

In some embodiments, the display apparatus is a foldable display apparatus.

In some embodiments, the display apparatus further includes a support portion disposed between the body portion of the flexible printed circuit and the display panel.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
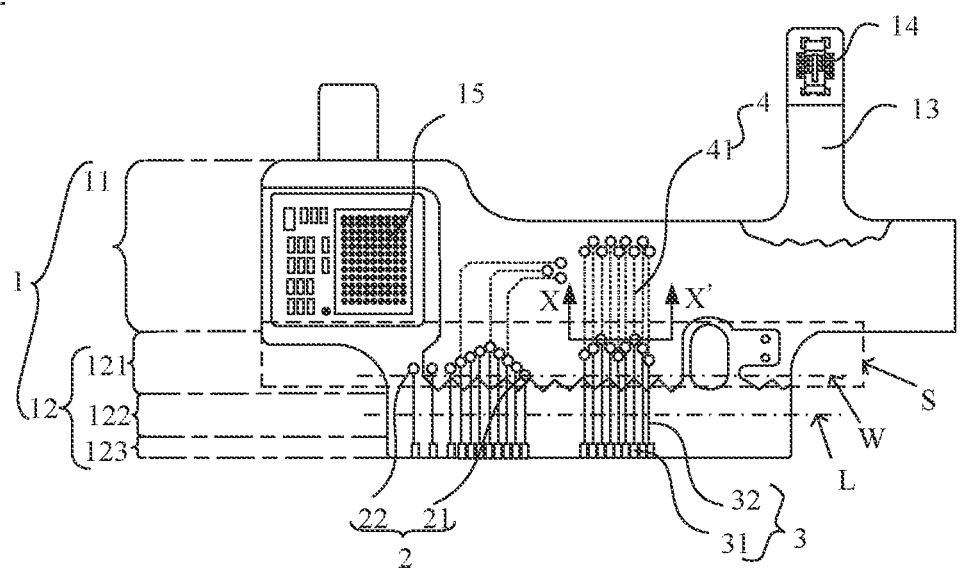
FIG. 1 is a structural diagram of a flexible printed circuit, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms "coupled" and "connected" and their derivatives may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of the phrase "applicable to" or "configured to" means an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term such as "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thickness of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a flexible printed circuit 100. As shown in FIG. 1, the flexible printed circuit 100 includes an insulating base 1, and the insulating base 1 includes a body portion 11 and at least one first extension portion 12 connected to an edge of the body portion 11. A first extension portion 12 includes a via region 121, a bending region 122 and a bonding region 123 that are sequentially away from the body portion 11. A plurality of vias 2 are disposed in the via region 121. The plurality of vias 2 includes at least one first via 21 and at least one second via 22. A center of an orthogonal projection of a first via 21 on a reference plane S perpendicular to a thickness direction of the insulating base 1 is located on a first straight line W parallel to a bending axis L of the bending region 122, and a center of an orthogonal projection of a second via 22 on the reference plane S is not located on the first straight line W.

The first straight line W is a reference straight line that is virtually set. For example, in all straight lines that are parallel to the bending axis L of the bending region 122 and overlap a center of an orthogonal projection of any via on the reference plane S, any straight line may be used as the first straight line W. In this case, a via 2 with the center of the orthogonal projection locating on the first straight line W is the first via 21, and there are one or more first vias 21; and a via 2 with the center of the orthogonal projection not locating on the first straight line W is the second via 22, and there are one or more second vias 22.

Since the plurality of vias 2 in the via region 121 include not only the first via 21 with the center of the orthogonal projection locating on the first straight line W, but also the second via 21 with the center of the orthogonal projection not locating on the first straight line W, when the via region 121 is subjected to tensile force generated by the bending region 122, a portion of the first extension portion 12 in the via region 121 is not prone to be cracked, thereby helping improve bending performance of the whole flexible printed circuit 100.

Referring to FIG. 1, the body portion 11 of the flexible printed circuit 100 may be used to be provided with a chip 15 and other electronic components thereon. For example, the chip 15 provided on the body portion 11 may be a touch chip, or the chip 15 provided on the body portion 11 may also be a driving control chip.

It will be noted that pins may be provided on a portion of the first extension portion 12 in the bonding region 123. In this way, by bonding the portion of the first extension portion 12 in the bonding region 123 to a display panel, the chip 15 (e.g., the touch chip or the driving control chip located on the body portion 11) in the flexible printed circuit may be connected to circuit(s) in the display panel through the pins located on the bonding region 123, so that the circuit(s) (e.g., a touch circuit or pixel driving circuits) in the display panel may be controlled through the chip 15 in the flexible printed circuit 100. As a result, a touch function and/or a display function of a display apparatus may be realized.

Since the center of the orthogonal projection of the first via 21 on the reference plane S is located on the first straight line W, and the center of the orthogonal projection of the second via 22 on the reference plane S is not located on the first straight line W, there is an included angle in a range from 0° to 90° between the first straight line W and a straight line where the center of the orthogonal projection of any first via 21 on the reference plane S and the center of the orthogonal projection of any second via 22 on the reference plane S are located.

Figure 2:
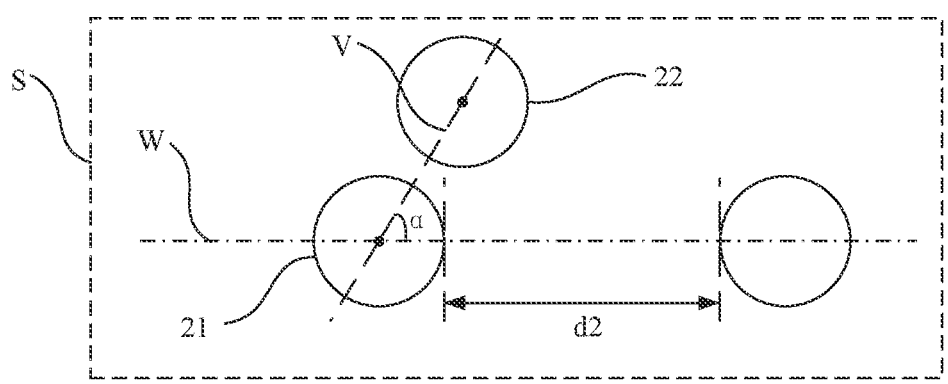
FIG. 2 is a distributional diagram of vias, in accordance with some embodiments of the present disclosure.

For example, as shown in FIG. 2, the straight line where the center of the orthogonal projection of the first via 21 on the reference plane S and the center of the orthogonal projection of the second via 22 on the reference plane S are located is a second straight line V. The included angle between the second straight line V and the first straight line W is α, and α is greater than 15°, and is less than or equal to 90° (15°<α≤90°).

With this arrangement, a distance between the center of the orthogonal projection of the first via 21 on the reference plane S and the center of the orthogonal projection of the second via 22 on the reference plane S in a direction perpendicular to the first straight line W is longer, so that the portion of the first extension portion 12 in the via region 121 is not prone to be cracked when being subjected to the tensile force, and the bending performance of the flexible printed circuit is further improved.

It is worth noting that in this example, there is no need to limit a distance between the first via 21 and the second via 22, as long as disconnection between the first via 21 and the second via 22 is ensured. Therefore, a distance between the first via 21 and the second via 22 in a direction parallel to the first straight line W may be set narrow, which helps provide a larger number of vias 2 in the via region 121.

Figure 3:
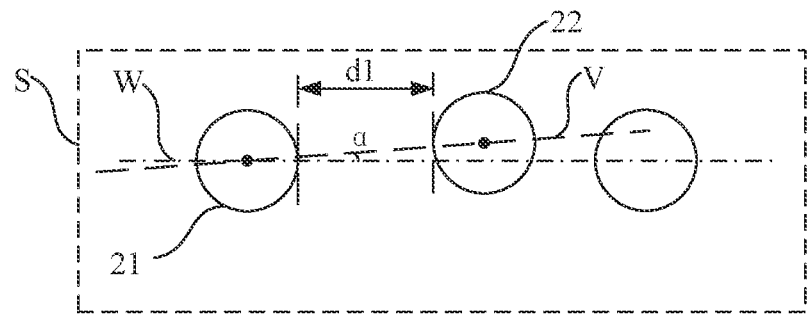
FIG. 3 is another distributional diagram of vias, in accordance with some embodiments of the present disclosure.

As another example, as shown in FIG. 3, the straight line where the center of the orthogonal projection of the first via 21 on the reference plane S and the center of the orthogonal projection of the second via 22 on the reference plane S are located is a second straight line V. The included angle between the second straight line V and the first straight line W is α, α is greater than 0°, and is less than or equal to 15° (0°<α≤15°), and a distance d1 between the first via 21 and the second via 22 in the direction parallel to the first straight line W is greater than or equal to 1 mm.

With this arrangement, the included angle between the first straight line W and the second straight line V is small (i.e., α is greater than 0°, and is less than or equal to 15° (0°<α≤15°)), which helps reduce a width of the via region in the direction perpendicular to the first straight line W. Moreover, since the distance d1 between the first via 21 and the second via 22 in the direction parallel to the first straight line W is greater than or equal to 1 mm, when the included angle between the first straight line W and the second straight line V is small, the distance d1 between the first via 21 and the second via 22 in the direction parallel to the first straight line W is large. As a result, the portion of the first extension portion 12 in the via region 121 is not prone to be cracked when being subjected to the tensile force generated by the bending region.

The distance d1 between the first via 21 and the second via 22 in the direction parallel to the first straight line W may be in a range from 1 mm to 2 mm. For example, the distance d1 is equal to or approaches 1 mm. In this way, it helps provide a large number of vias 2 in the via region. As another example, the distance d1 is equal to or approaches 2 mm. In this way, it helps improve an anti-cracking effect of the via region.

In some embodiments, as shown in FIG. 2, a distance d2 between two adjacent first vias 21 is greater than or equal to 2 mm. Through this arrangement, the distance d2 between the two adjacent first vias 21 is large, that is, an area of a connecting portion between the two adjacent vias 2 is large. In this way, even if centers of orthogonal projections of the two adjacent first vias 21 on the reference plane S are both located on the same straight line, the connecting portion between the two adjacent vias 2 is not prone to be cracked when the via region is subject to the tensile force generated by the bending region. Therefore, the via region of the flexible printed circuit is not prone to be cracked, and circuit(s) in the flexible printed circuit are not prone to damage due to the cracking of the via region, which helps improve a service life of the flexible printed circuit.

Figure 4:
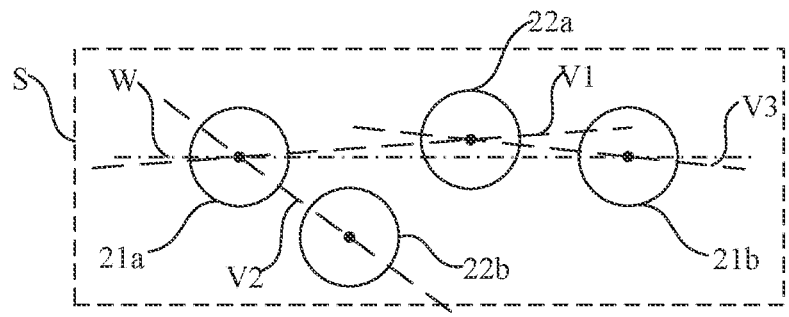
FIG. 4 is yet another distributional diagram of vias, in accordance with some embodiments of the present disclosure.

It will be noted that the center of the orthogonal projection of any first via 21 on the reference plane S and the center of the orthogonal projection of any second via 22 on the reference plane S may be located on a second straight line V. For example, as shown in FIG. 4, a center of an orthogonal projection of a first via 21a on the reference plane S and a center of an orthogonal projection of a second via 22a on the reference plane S are located on a second straight line V1. Or, the center of the orthogonal projection of the first via 21a on the reference plane S and a center of an orthogonal projection of a second via 22b on the reference plane S are located on a second straight line V2. Or, the center of the orthogonal projection of the second via 22a on the reference plane and a center of an orthogonal projection of a first via 21b on the reference plane S are located on a second straight line V3.

Figure 5A:
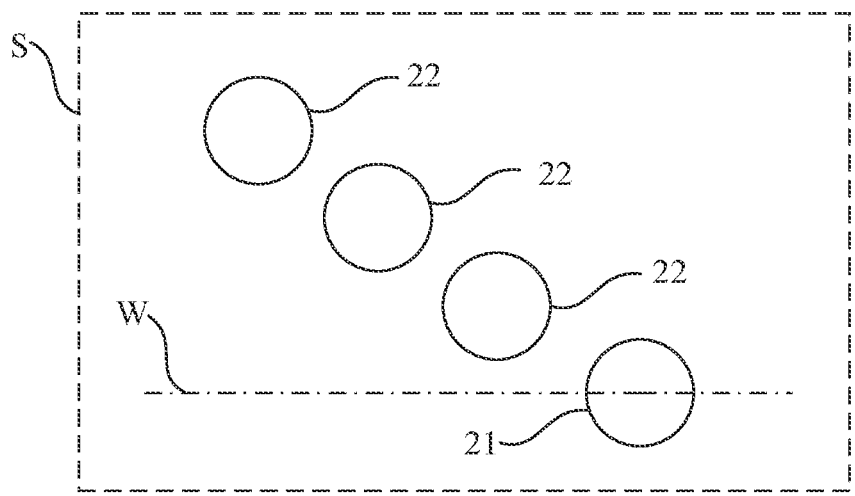
FIG. 5A is yet another distributional diagram of vias, in accordance with some embodiments of the present disclosure.
Figure 5B:
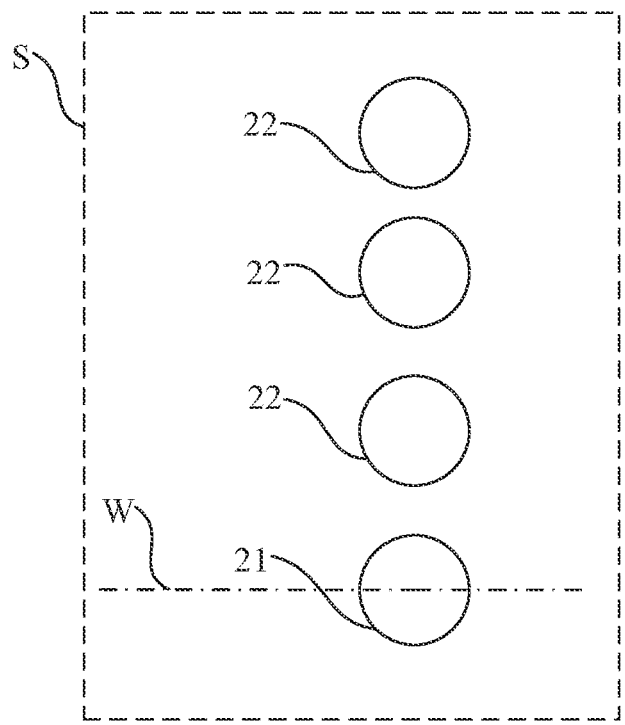
FIG. 5B is yet another distributional diagram of vias, in accordance with some embodiments of the present disclosure.
Figure 5C:
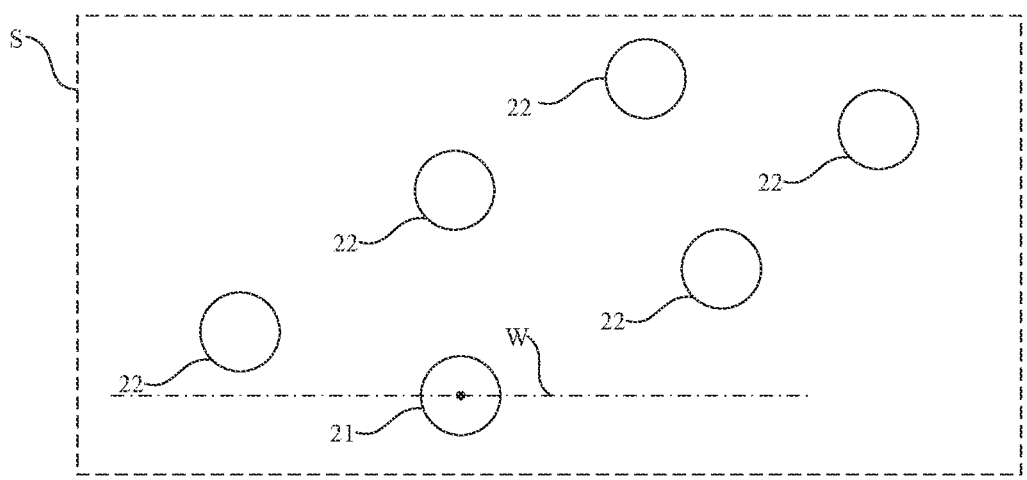
FIG. 5C is yet another distributional diagram of vias, in accordance with some embodiments of the present disclosure.

In some embodiments, as shown in FIGS. 5A to 5C, centers of orthogonal projections of any two vias 2 in the plurality of vias 2 on the reference plane S are not located on a same straight line parallel to the bending axis of the bending region. That is, in a case where the center of the orthogonal projection of one via 2 on the reference plane S is located on the first straight line W parallel to the bending axis of the bending region, orthogonal projections of remaining vias 2 in the plurality of vias 2 on the reference plane S are not located on the first straight line W. For example, there is only one first via 21 in the plurality of vias 2, the first via 21 may be any via 2 in the plurality of vias 2, and remaining vias 2 are all second vias 22. In this way, when the portion of the first extension portion 12 in the via region 121 is subject to the tensile force generated by the bending region, since there is only one via appears at every interval in the direction perpendicular to the first straight line, the portion of the first extension portion 12 in the via region 121 is not prone to be cracked, thereby further improving the bending performance of the flexible printed circuit.

It will be noted that FIGS. 5A to 5C only illustrate three possible cases of the description "centers of orthogonal projections of any two vias 2 in the plurality of vias 2 on the reference plane S are not located on a same straight line parallel to the bending axis of the bending region" in the embodiments of the present disclosure. The embodiments of present disclosure are not limited to the solutions shown in FIGS. 5A to 5C.

Figure 6:
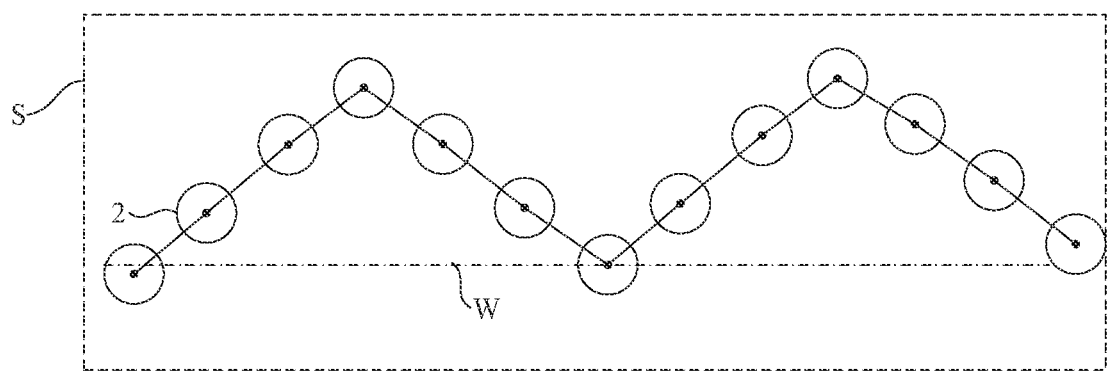
FIG. 6 is yet another distributional diagram of vias, in accordance with some embodiments of the present disclosure.

In some embodiments, as shown in FIG. 6, the plurality of vias 2 are sequentially divided into at least two parts of vias in the direction (e.g., the direction from left to right in FIG. 6) parallel to the first straight line W. In two adjacent parts of vias, a part of vias (e.g., first four vias counted from left to right in FIG. 6) are gradually away from the bending region in the direction perpendicular to the first straight line, and another part of vias (e.g., fifth to seventh vias counted from left to right in FIG. 6) are gradually proximate to the bending region in the direction perpendicular to the first straight line.

Figure 7:
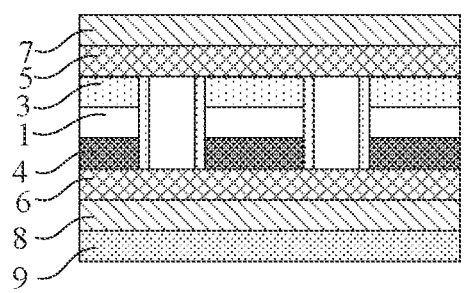
FIG. 7 is a sectional view of the flexible printed circuit shown in FIG. 1 along the X-X' line.

In some embodiments, as shown in FIGS. 1 and 7, the flexible printed circuit 100 further includes a first conductive layer 3 disposed on a first surface of the insulating base 1. The first conductive layer 3 includes a plurality of first pins 31 and a plurality of first conductive traces 32. The plurality of first pins 31 are located in the bonding region 123, and first ends of the plurality of first conductive traces 32 are connected in a one-to-one correspondence with at least a part of first pins 31 in the plurality of first pins 31. The flexible printed circuit 100 further includes a second conductive layer 4 disposed on a second surface, opposite to the first surface, of the insulating base 1. The second conductive layer 4 includes a plurality of second conductive traces 41, and first ends of the plurality of second conductive traces 41 are connected in a one-to-one correspondence with second ends of the plurality of first conductive traces 32 through the vias 2.

Figure 8:
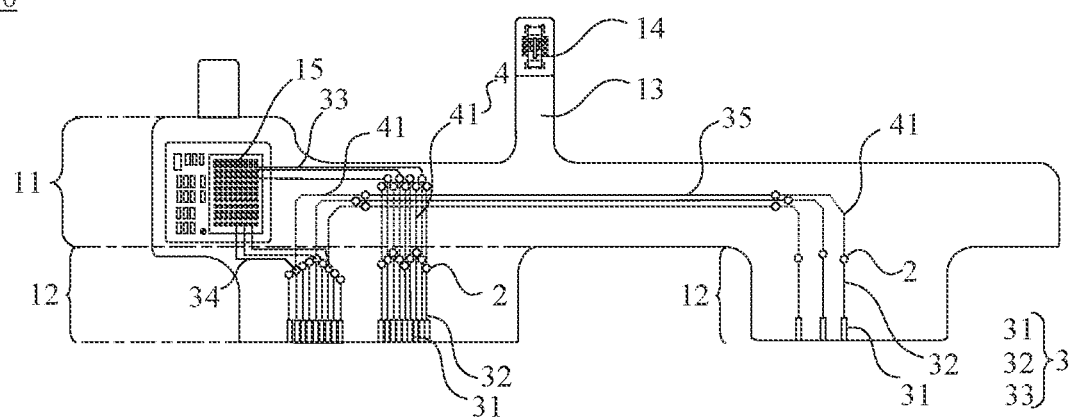
FIG. 8 is a structural diagram of another flexible printed circuit, in accordance with some embodiments.

Second ends of the plurality of second conductive traces 41 may be directly or indirectly connected to the chip 15 (e.g., the touch chip or the driving control chip). For example, as shown in FIG. 8, the first conductive layer 3 may further include third conductive traces 33 connected to the chip 15 located on the body portion 11. In this case, the second ends of the second conductive traces 41 may be connected to the third conductive traces 33 through vias located in the body portion 11. As another example, the second ends of the second conductive traces 41 may also be directly connected to the chip 15 through vias located in the body portion 11 on which the chip 15 is provided.

There is one first extension portion 12 or multiple first extension portions 12 in the flexible printed circuit 100.

In some embodiments, as shown in FIG. 8, the number of the first extension portions 12 may be two. In this case, a part of first pins 31 in the plurality of first pins 31 are located in the bonding region 123 of one of the first extension portions 12, and another part of first pins 31 in the plurality of first pins 31 are located in the bonding region 123 of another of the first extension portions 12. First ends of a part of first conductive traces 32 in the plurality of first conductive traces 32 are connected in a one-to-one correspondence with at least a part of first pins 31 in the part of first pins 31, and first ends of another part of first conductive traces 32 in the plurality of first conductive traces 32 are connected in a one-to-one correspondence with at least a part of first pins 31 in the another part of first pins 31. First ends of a part of second conductive traces 41 in the plurality of second conductive traces 41 are connected in a one-to-one correspondence with second ends of the part of first conductive traces 32 through vias 2 in the first extension portion 12, and first ends of another part of second conductive traces 41 in the plurality of second conductive traces 41 are connected in a one-to-one correspondence with second ends of the another part of first conductive traces 32 through vias 2 in the another first extension portion 12.

On this basis, for example, as shown in FIG. 8, the first conductive layer 3 further includes a plurality of fourth conductive traces 34 and a plurality of fifth conductive traces 35. The plurality of fourth conductive traces 34 may be connected to the chip 15 and first conductive traces 32.

First ends of the plurality of fifth conductive traces 35 may be connected to second ends of a part of second conductive traces 41 in the plurality of second conductive traces 41 through vias located in the body portion 11, and second ends of the plurality of fifth conductive traces 35 may be connected to second ends of another part of second conductive traces 41 in the plurality of second conductive traces 41 through vias located in the body portion 11.

With this arrangement, output terminals of the chip 15 may be connected to the first pins 31 on two first extension portions 12.

In some embodiments, referring to FIG. 8, the two first extension portions 12 are both connected to a first side edge of the body portion 11. In this way, the flexible printed circuit 100 includes the two first extension portions 12, and the circuit(s) in the flexible printed circuit 100 may be electrically connected to the circuit(s) in the display panel through the two first extension portions 12. For example, the touch chip (e.g., the chip 15) is disposed on the body portion 11. In a case where the flexible printed circuit 100 includes the two first extension portions 12, output terminals of the touch chip may be connected to touch electrodes in the display panel through the first pins 31 on the two first extension portions 12. In this way, the touch chip may be connected to the touch electrodes through two parts of conductive traces, which helps reduce a resistance between the touch chip and the touch electrodes, and improve a control accuracy of a touch control circuit in the display apparatus.

In some embodiments, as shown in FIGS. 1 and 8, the insulating base 1 further includes a second extension portion 13, and the flexible printed circuit 100 further includes a plug-in structure 14. The second extension portion 13 is connected to a second side edge of the body portion 11, and the first side edge and the second side edge are located on opposite sides of the body portion 11. The plug-in structure 14 is disposed at an end of the second extension portion 13 away from the body portion 11. The plug-in structure 14 is configured to be plugged into, for example, a main control circuit board of the display apparatus.

In some embodiments, as shown in FIG. 7, the flexible printed circuit 100 further includes a first insulating layer 5, a second insulating layer 6, a first shielding layer 7 and a second shielding layer 8. The first insulating layer 5 is located on a side of the first conductive layer 3 away from the insulating base 1. The second insulating layer 6 is located on a side of the second conductive layer 4 away from the insulating base 1. The first shielding layer 7 is located on a side of the first insulating layer 5 away from the insulating base 1, and the first shielding layer 7 covers the body portion 11 and the via region 121. The second shielding layer 8 is located on a side of the second insulating layer 6 away from the insulating base 1, and the second shielding layer 8 covers the body portion 11 and the via region 121. The first shielding layer 7 and the second shielding layer 8 may shield electromagnetic waves, thereby preventing electrical signals transmitted by the conductive traces in the flexible printed circuit from being affected.

Figure 9:
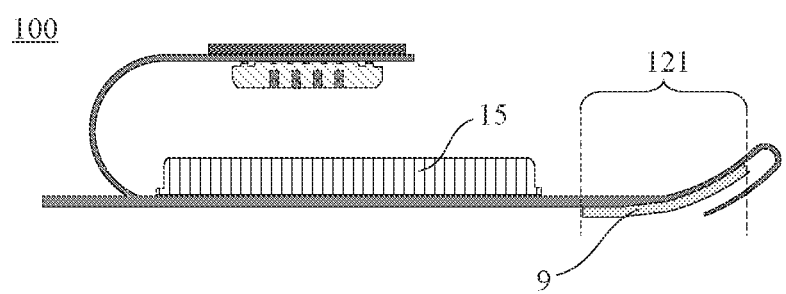
FIG. 9 is a structural diagram of yet another flexible printed circuit, in accordance with some embodiments.

In some embodiments, as shown in FIGS. 7 and 9, the flexible printed circuit 100 further includes a protective layer 9. The protective layer 9 is disposed on a side of the second shielding layer 8 away from the insulating base 1, and the protective layer 9 covers the via region 121. The protective layer 9 is used to protect the via region 121 and prevent the portion of the first extension portion 12 in the via region 121 from being cracked when the portion of the first extension portion 12 in the via region 121 is subject to the tensile force.

Figure 10:
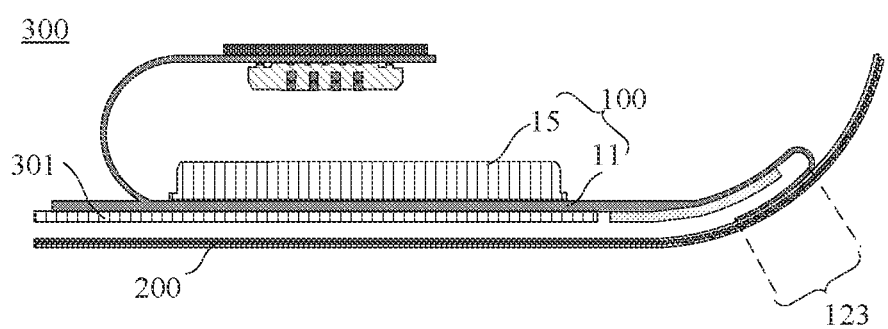
FIG. 10 is a structural diagram of a display apparatus, in accordance with some embodiments.

Some embodiments of the present disclosure further provide a display apparatus 300. As shown in FIG. 10, the display apparatus 300 includes the flexible printed circuit 100 described in any of the above embodiments of the present disclosure and a display panel 200, and the portion of the first extension portion 12 of the flexible printed circuit 100 in the bonding region 123 is bonded to the display panel 200.

The display apparatus 300 may be a foldable display apparatus, and a bending axis of the foldable display apparatus is substantially parallel to the bending axis of the bending region of the flexible printed circuit 100. Herein, the expression "substantially parallel" means that the bending axis of the foldable display apparatus and the bending axis of the bending region of the flexible printed circuit 100 are parallel to each other, or that the two are approximately parallel (e.g., an included angle between orthogonal projections of the two on the reference plane is less than or equal to 10 degrees).

It will be noted that when the foldable display apparatus is bent along the bending axis of the foldable display apparatus, the display panel is also bent, which will cause the flexible printed circuit bonded to the display panel to dislocate. When the flexible printed circuit is dislocated, the via region will be affected by the tensile force generated by the bending region. In this case, if centers of orthogonal projections of the plurality of vias disposed in the via region the reference plane are all located on a same straight line that is parallel to the bending axis of the bending region, the via region is easily cracked, resulting in the flexible printed circuit being damaged. As a result, the display apparatus cannot realize the touch function and/or the display function.

However, in the flexible printed circuit 100 provided in the embodiments of the present disclosure, the plurality of vias 2 in the via region 121 includes not only the first via 21 with the center of the orthogonal projection located on the first straight line W, but also the second via 22 with the center of the orthogonal projection not located on the first straight line W, so that when the portion of the first extension portion 12 in the via region 121 is dislocated due to the tensile force generated by the bending region 122, the portion of the first extension portion 12 in the via region 121 is not prone to be cracked, and the whole flexible printed circuit 100 has strong bending performance. Therefore, the foldable display apparatus adopting the flexible printed circuit provided in the above embodiments of the present disclosure has the high reliability and long service life.

In some embodiments, as shown in FIG. 10, the display apparatus 300 further includes a support portion 301, and the support portion 301 is disposed between the body portion of the flexible printed circuit 100 and the display panel 200. In this case, the support portion 301 may support the body portion 11 of the flexible printed circuit 100, so that the body portion 11 is not prone to shaking even if the chip 15 or other electronic devices are installed, which helps improve the service life of the flexible printed circuit.

The display apparatus 300 may be any component having a display function, such as a television, a digital camera, a mobile phone, a watch, a tablet computer, a notebook computer, a navigator, etc.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A flexible printed circuit, comprising:
an insulating base, the insulating base including a body portion and at least one first extension portion connected to an edge of the body portion, wherein
a first extension portion includes a via region, a bending region and a bonding region that are sequentially away from the body portion;
a plurality of vias are disposed in the via region, and the plurality of vias include at least one first via and at least one second via, wherein a center of an orthogonal projection of a first via on a reference plane perpendicular to a thickness direction of the insulating base is located on a first straight line parallel to a bending axis of the bending region, and a center of an orthogonal projection of a second via on the reference plane is not located on the first straight line,
a straight line where the center of the orthogonal projection of the first via on the reference plane and the center of the orthogonal projection of the second via on the reference plane are located is a second straight line; an included angle between the second straight line and the first straight line is α, α is greater than 0°, and is less than or equal to 15° (0°<α≤15°); and a distance between the first via and the second via in a direction parallel to the first straight line is greater than or equal to 1 mm;
the distance between the first via and the second via in the direction parallel to the first straight line is in a range from 1 mm to 2 mm; and
a distance between two adjacent first vias in the direction parallel to the first straight line is greater than or equal to 2 mm.

2. The flexible printed circuit according to claim 1, wherein
the plurality of vias are sequentially divided into at least two parts of vias in a direction parallel to the first straight line; in two adjacent parts of vias, a part of vias are gradually away from the bending region in a direction perpendicular to the first straight line, and another part of vias are gradually proximate to the bending region in the direction perpendicular to the first straight line.

3. The flexible printed circuit according to claim 1, further comprising:

a first conductive layer disposed on a first surface of the insulating base, wherein the first conductive layer includes a plurality of first pins and a plurality of first conductive traces, the plurality of first pins are located in the bonding region, and first ends of the plurality of first conductive traces are connected in a one-to-one correspondence with at least a part of first pins in the plurality of first pins; and
a second conductive layer disposed on a second surface, opposite to the first surface, of the insulating base, wherein the second conductive layer includes a plurality of second conductive traces, and first ends of the plurality of second conductive traces are connected in a one-to-one correspondence with second ends of the plurality of first conductive traces through the plurality of vias.

4. The flexible printed circuit according to claim 3, wherein
the at least one first extension portion includes two first extension portions;
a part of first pins in the plurality of first pins are located in the bonding region of one of the two first extension portions; and another part of first pins in the plurality of first pins are located in the bonding region of another first extension portion;
first ends of a part of first conductive traces in the plurality of first conductive traces are connected in a one-to-one correspondence with at least a part of first pins in the part of first pins, and first ends of another part of first conductive traces in the plurality of first conductive traces are connected in a one-to-one correspondence with at least a part of first pins in the another part of first pins; and
first ends of a part of second conductive traces in the plurality of second conductive traces are connected in a one-to-one correspondence with second ends of the part of first conductive traces through vias in the first extension portion, and first ends of another part of second conductive traces in the plurality of second conductive traces are connected in a one-to-one correspondence with second ends of the another part of first conductive traces through vias in the another first extension portion.

5. The flexible printed circuit according to claim 4, wherein
the two first extension portions are both connected to a first side edge of the body portion.

6. The flexible printed circuit according to claim 5, wherein
the insulating base further includes: a second extension portion connected to a second side edge of the body portion, the first side edge and the second side edge being located on opposite sides of the body portion; and
the flexible printed circuit further includes a plug-in structure disposed at an end of the second extension portion away from the body portion.

7. The flexible printed circuit according to claim 1, further comprising:
a first insulating layer located on a side of the first conductive layer away from the insulating base;
a second insulating layer located on a side of the second conductive layer away from the insulating base;
a first shielding layer located on a side of the first insulating layer away from the insulating base, the first shielding layer covering the body portion and the via region; and a second shielding layer located on a side of the second insulating layer away from the insulating base, the second shielding layer covering the body portion and the via region, wherein the first shielding layer and the second shielding layer are used to shield electromagnetic waves.

8. The flexible printed circuit according to claim 7, further comprising:

a protective layer disposed on a side of the second shielding layer away from the insulating base, the protective layer covering the via region.

9. A display apparatus, comprising:

the flexible printed circuit according to claim 1; and a display panel, a portion of the first extension portion of the flexible printed circuit in the bonding region being bonded to the display panel.

10. The display apparatus according to claim 9, wherein the display apparatus is a foldable display apparatus.

11. The display apparatus according to claim 9, further comprising:

a support portion disposed between the body portion of the flexible printed circuit and the display panel.

12. The flexible printed circuit according to claim 2, wherein the plurality of vias are sequentially divided into four parts of vias in the direction parallel to the first straight line.

13. The flexible printed circuit according to claim 3, further comprising:

a chip disposed on the body portion, wherein second ends of the plurality of second conductive traces are directly or indirectly connected to the chip.

14. The flexible printed circuit according to claim 13, wherein the first conductive layer further includes a plurality of fourth conductive traces and a plurality of fifth conductive traces, the plurality of fourth conductive traces are connected to the chip and first conductive traces, and first ends of the plurality of fifth conductive traces are connected to a part of second conductive traces in the plurality of second conductive traces, and second ends of the plurality of fifth conductive traces are connected to second ends of another part of second conductive traces in the plurality of second conductive traces.

15. The flexible printed circuit according to claim 13, wherein the chip is a touch chip or driving control chip.

* * * * *